United States Patent [19]

Taketoshi

[11] 4,289,369

[45] Sep. 15, 1981

[54] EXCHANGEABLE GA-CU ELECTRODE FOR AN EVAPORATION SYSTEM

[75] Inventor: Kazuhisa Taketoshi, Sagamihara, Japan

[73] Assignee: Nippon Hoso Kyokai, Tokyo, Japan

[21] Appl. No.: 121,791

[22] Filed: Feb. 15, 1980

Related U.S. Application Data

[62] Division of Ser. No. 72,291, Sep. 4, 1979, Pat. No. 4,239,534.

[30] Foreign Application Priority Data

Sep. 9, 1978 [JP] Japan ................................. 53-110236

[51] Int. Cl.³ .............................................. H01R 3/08
[52] U.S. Cl. .................................................. 339/118 R
[58] Field of Search ............................. 75/134 T, 153; 339/118 R, 118 RY, 8 L

[56] References Cited

U.S. PATENT DOCUMENTS

| | | | |
|---|---|---|---|
| 768,175 | 8/1904 | Fritchle | 339/118 R |
| 827,702 | 8/1906 | Betts | 339/118 R |
| 1,170,388 | 2/1916 | Anschutz-Kaempfe | 339/8 L |
| 1,792,973 | 2/1931 | Frenz | 339/118 R |
| 3,021,496 | 2/1962 | Kenyon | 339/118 RY |
| 3,141,238 | 7/1964 | Harman, Jr. | 75/134 T |
| 3,431,532 | 3/1969 | Cary | 339/8 L |

FOREIGN PATENT DOCUMENTS 658020   2/1963   Canada ........................ 339/118 R

OTHER PUBLICATIONS

Tikhomirova et al.; "A Study of Mutual Diffusion in the System Gallium14 Copper"; Physics of Metals & Metallography; vol. 29; No. 4; 1970; pp. 120–126.

Hansen; "Cu-Ga Copper-Gallium"; Constitution of Binary Alloys; McGraw-Hill, N.Y. 1958; pp. 582–584.

Thomas, G.; "Transmission Electron Microslopy of Metals"; John Wiley & Sons, Inc., N.Y. 1962, pp. 101; 103.

Chopra; "Thin Film Phenomena", McGraw-Hill; N.Y. 1969; pp. 57–58.

Holland, "Vacuum Deposition of Thin Films"; 1060; pp. 7–15.

"Theories and Applications of Electron Microscopes", Maruzen Co., The Society of Electron Microscope, Japan, 1964.

*Primary Examiner*—John McQuade
*Attorney, Agent, or Firm*—Stevens, Davis, Miller & Mosher

[57] ABSTRACT

Ga-Cu alloy having the formula of $Ga_{1-x}Cu_x$, wherein x is a composition ratio parameter of Ga and Cu in a range of $0.000 \leq x \leq 0.05$. The alloy has a stable liquid phase at the normal temperature. The Ga-Cu alloy $Ga_{1-x}Cu_x$ with a composition ratio parameter x ($0.0001 \leq x \leq 0.03$) is assembled into the exchangeable electrode of an evaporation system in such a way that the Ga-Cu alloy is filled in a clearance portion between a fixed electrode section fixed within the vacuum chamber of the evaporation system and an exchangeable electrode section on which an evaporation source is to be placed. With this construction, both of the fixed and exchangeable electrode sections are electrically connected with each other via the Ga-Cu alloy, and the exchangeable electrode section can be easily and rapidly removed from and placed onto the fixed electrode section.

2 Claims, 8 Drawing Figures

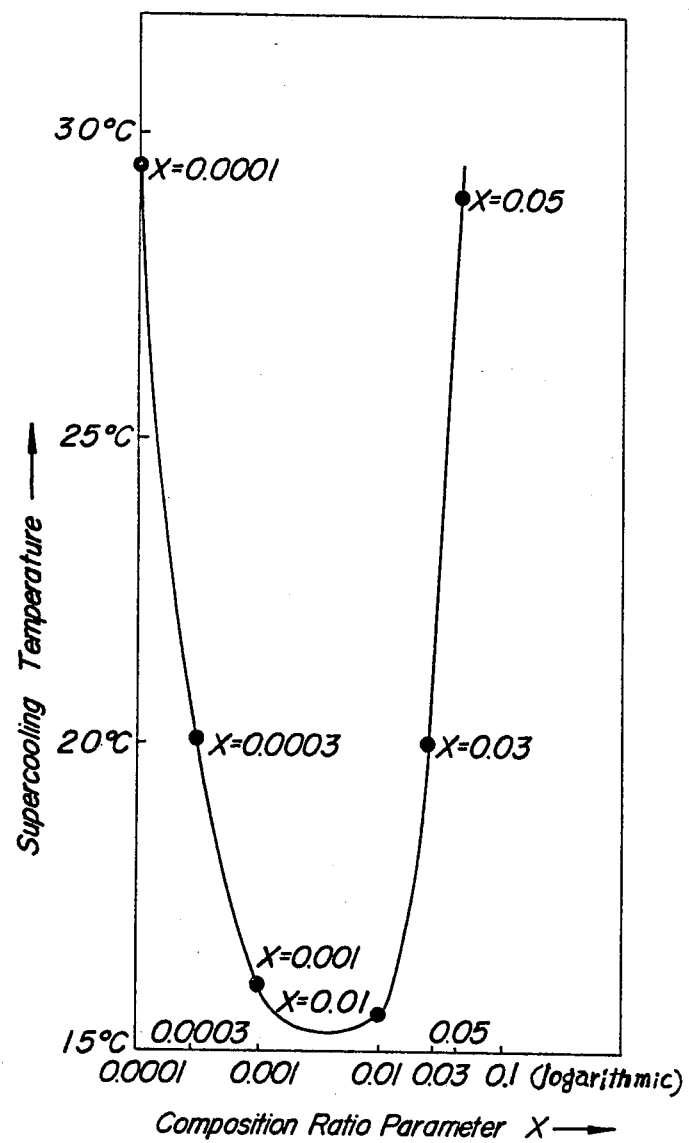

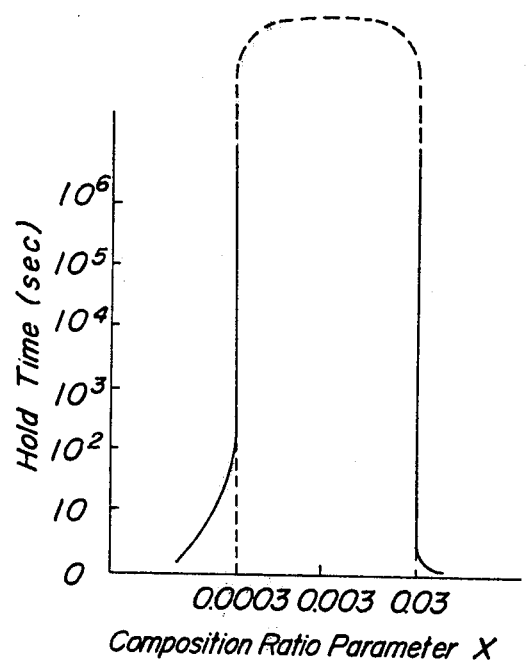
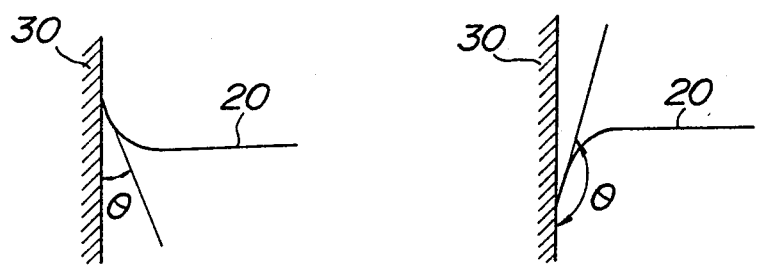
FIG.4A   FIG.4B
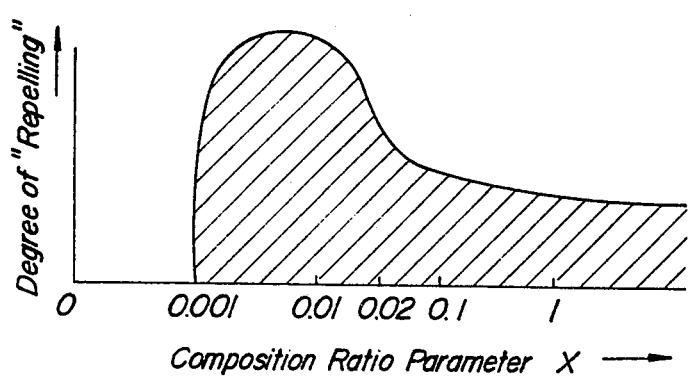
FIG.5

EXCHANGEABLE GA-CU ELECTRODE FOR AN EVAPORATION SYSTEM

This application is a divisional application of Ser. No. 72,291, filed Sept. 4, 1979, now U.S. Pat. No. 4,239,534.

BACKGROUND OF THE INVENTION

The present invention relates to gallium-copper (Ga-Cu) alloy which exhibits a liquid phase at the normal temperature and to an exchangeable electrode for an evaporation system in which the Ga-Cu alloy is used.

A conventional electron microscope is disclosed in the following literatures (1) and (2).
(1) "Transmission Electron Microscopy of Metals", FIG. 59 on page 103, by Gareth Thomas, published by John Wiley & Sons, Inc. in 1962.
(2) "Theories and Applications of Electron Microscope—I. Fundamental Theories and Manipulation of Electron Microscope" edited by The Society of Electron Microscope of Japan and published by Maruzen Company on Sept. 25, 1964.

In an electron microscope, the following method has been employed for the purpose of a rapid exchange of observing samples. A preevacuation chamber is provided in association with a high vacuum chamber. In advance of exchanging specimens, a specimen is placed in the preevacuation chamber and then the preevacuation chamber is preevacuated by a rotary pump or the like. When a specimen is exchanged with a new specimen, the new source already placed in the preevacuation chamber is transported to the high vacuum chamber so that the new specimen is placed therein in lieu of the old specimen.

If the above-mentioned microscopic method of exchanging observing specimens can be applied for an evaporation system, an evaporation sample, i.e., an evaporation source material could be exchanged with a new source material, without deteriorating an atmosphere within the vacuum chamber of the evaporation system. As a result, it is estimated that an exhausting time of the vacuum chamber is remarkably reduced and further that the reproducibility of evaporation is also considerably improved, since the condition of residual gases, i.e. background atmosphere, within the vacuum chamber is stable.

In the case of an evaporation system, however, the evaporation of the source material by feeding a large current into the source material is required in addition to the mere replacement or exchange of evaporation source material. For example, the current fed into a conventional boat type evaporation source ranges usually from 100 to 200 A. This needs a strong and tight contact of the evaporation source material with electrodes fixed within the vacuum chamber in order to ensure a stable feeding of a large current.

In this respect, if the sample exchange method used in the case of an electron microscope is applied to the evaporation system, one encounters a difficulty in removing the evaporation source in strong contact with the fixed electrode from the vacuum chamber or in placing a new source material into the vacuum chamber to in turn make it firmly contact the fixed electrode, through a manual operation from outside. With this in view, it is usual in the case of an evaporation system that the vacuum chamber is opened to allow air to be introduced into the vacuum chamber and that the old source material is removed directly by hand and then a new source material is fixed onto the electrode, for example, by screwing the source material to the electrode by hand, at every time that the exchange of source material is required. This conventional vacuum evaporation system is disclosed in "Vacuum Deposition of Thin Films", FIG. 1.2 on page 8; by L. Holland, F. Inst. P. published in 1960, or in "THIN FILM PHENOMENA", FIGS. 11 and 12 on pages 57 and 58; by Kasturi L. Chopra published by McGraw-Hill Book Company in 1969.

SUMMARY OF THE INVENTION

With the above in view, an object of the present invention is to provide Ga-Cu alloy which exhibits a liquid phase at the normal temperature.

Another object of the present invention is to provide Ga-Cu alloy which can preferably be used as a part of an exchangeable electrode for an evaporation system.

Still another object of the present invention is to provide an exchangeable electrode for an evaporation system which allows an easy, smooth and rapid exchange of evaporation sources.

The applicant has recognized and discovered unique and novel natures of Ga-Cu alloy. When gallium (Ga) and copper (Cu) are alloyed within a specific range of the composition ratio between Ga and Cu, the alloy thus prepared has a supercooling condition at the normal temperature in which the alloy exhibits a liquid phase at the normal temperature and the liquid alloy is never evaporated unlike mercury having a similar nature of a liquid phase.

The Ga-Cu alloy effectively exhibiting the above-mentioned unique nature has a composition ratio parameter $x$ within a range of $0.0001 \leq x \leq 0.05$, when the Ga-Cu alloy is expressed by $Ga_{1-x}Cu_x$.

Also in the present invention, the Ga-Cu alloy $Ga_{1-x}Cu_x$ with a composition ratio parameter $x$ ($0.0001 \leq x \leq 0.03$) is assembled into the exchangeable electrode of an evaporation system in such a way that the Ga-Cu alloy is filled in a clearance portion between a fixed electrode section fixed within the vacuum chamber of the evaporation system and an exchangeable electrode section on which an evaporation source is to be placed. With this construction, both of the fixed and exchangeable electrode sections are electrically connected with each other via the Ga-Cu alloy, and the exchangeable electrode section can be easily and rapidly removed from and placed onto the fixed electrode section. Apparently, this approach successfully remedies the above-mentioned disadvantages of the difficulty in exchanging the evaporation sources in an evaporation system.

Other objects and features of the present invention will be apparent from the following description taken in connection with the accompanying drawings, in which:

BRIEF DESCRIPTION OF THE DRAWINGS

FIG. 2 is a graph illustrating a relationship between composition parameter $x$ of the Ga-Cu alloy and supercooling temperature;

FIG. 3 is a graph illustrating a relationship between the composition ratio parameter $x$ and hold time;

FIGS. 4A and 4B diagrammatically illustrate states of "wetting" and "repelling" of the Ga-Cu alloy with respect to a copper or stainless steel member;

FIG. 5 is a graph illustrating a relationship of "repelling" with the composition ratio parameter x;

DESCRIPTION OF THE PREFERRED EMBODIMENTS

The composition of a Ga-Cu alloy according to the invention, which is well adaptable for an electrode in a vacuum chamber of an evaporation system, will first be described.

Figure 1:
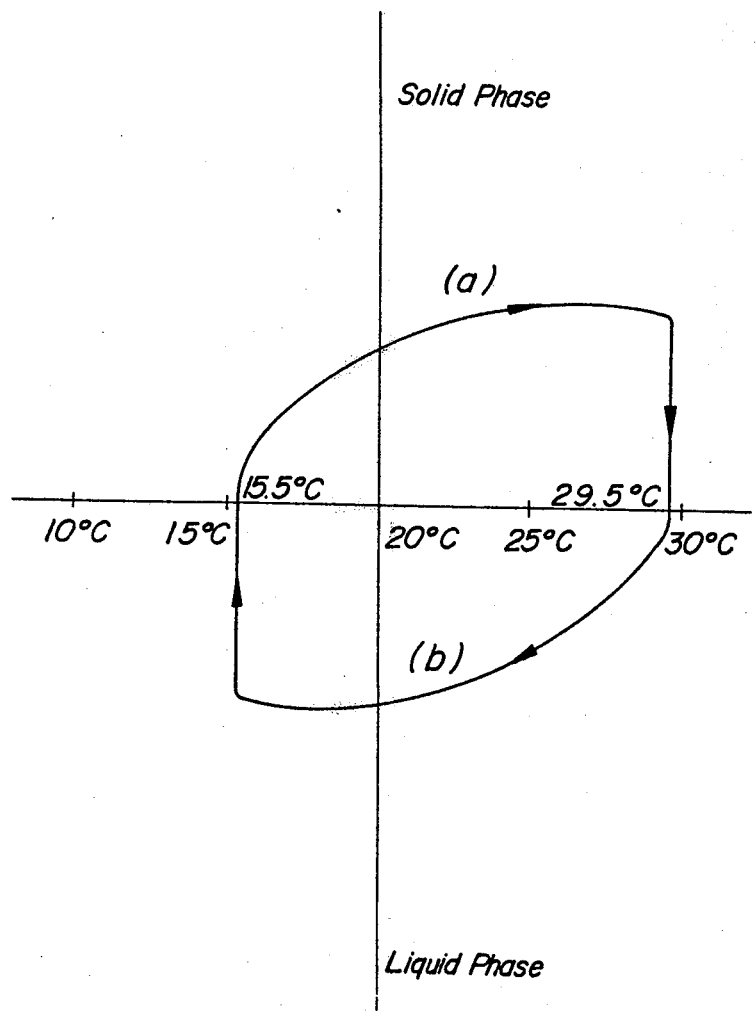
FIG. 1 is a graph illustrating a relationship between liquid and solid phases of Ga-Cu alloy and temperature.

A relationship between liquid and solid phases and temperature of $Ga_{1-x}Cu_x$ alloy is illustrated in FIG. 1 in case that a composition ratio parameter x of the alloy is 0.01, i.e. x=0.01. The Ga-Cu alloy exhibits a solid phase at temperature 29.5° C. or less as illustrated in a region (a). When the alloy is heated to temperature of 29.5° C. or more, the alloy is melted and changes to a liquid phase as illustrated in a region (b). Once the alloy transfers its solid phase into the liquid phase, it holds supercooling condition even at 29.5° C. or less as illustrated in the region (b) and maintains its liquid phase down to 15.5° C. Such the liquid phase of the Ga-Cu alloy was very stable and the Ga-Cu alloy maintained still its liquid phase after the alloy was continuously used as an exchangeable electrode for one year or more while the Ga-Cu alloy was mechanically shocked or supplied with a current, as proved by my experiment. Thus, within a temperature range from 15.5° C. to 29.5° C., the alloy never showed a sudden transfer from the liquid phase in the region (b) to the solid phase in the region (a). The minimum temperature of the supercooling (15.5° C. in FIG. 1) is hereinafter called a supercooling temperature.

A relationship between the composition ratio parameter x of the $Ga_{1-x}Cu_x$ alloy and the supercooling temperature is graphically illustrated in FIG. 2. As seen from the graph in FIG. 2, the composition ratio parameter x of the $Ga_{1-x}Cu_x$ alloy in which the alloy exhibits the liquid phase at temperature 20° C. (normal temperature) ranges from $3 \times 10^{-4}$ to $3 \times 10^{-2}$. When the temperature is allowed up to 30° C., the parameter x ranges from $1 \times 10^{-4}$ to $5 \times 10^{-2}$.

A relationship between the composition ratio parameter x of the $Ga_{1-x}Cu_x$ alloy and hold time is graphically illustrated in FIG. 3. The hold time means a period of time during which the alloy holds its supercooling condition stably. As seen from FIG. 3, within a parameter range from 0.0003 to 0.03, the hold time is extremely long as indicated by dotted lines and the liquid phase in the region (b) shown in FIG. 1 lasts semipermanently. When the parameter x is smaller than 0.0003 or larger than 0.03, the hold time is shortened, so that the liquid phase of the alloy lasts only for a shorter time.

In summary, the composition ratio parameter x of the $Ga_{1-x}Cu_x$ alloy in which the alloy stably holds its liquid phase for a long time at the normal temperature 20° C. ranges from 0.0003 to 0.03. When the supercooling temperature is allowed to be set at 29.5° C., the parameter range in which the alloy holds a stable liquid phase can be widened to a range from 0.0001 to 0.05, as illustrated in FIG. 2. In addition, when the hold time shown in FIG. 3 is taken into consideration, a range from 0.0001 to 0.03 is preferably determined as a composition ratio parameter x. Consequently, the $Ga_{1-x}Cu_x$ alloy having the parameter range from 0.0001 to 0.03 exhibits a stable liquid phase within a range of supercooling temperature from 15.5° C. to 29.5° C. Therefore, this alloy may be used for the contacting material of an exchangeable electrode of an evaporation system, which will be described later.

A condition of "adhesion" of a $Ga_{1-x}Cu_x$ alloy with respect to Cu or stainless steel as illustrated in FIGS. 4A and 4B. The condition of "adhesion" or a term "wetting" means that a contact angle $\theta$ of liquid phase alloy 20 with Cu or stainless steel 30 is acute. A term "repelling" is an antonym of a condition of the "adhesion" and means that a contact angle $\theta$ of the liquid alloy 20 with Cu or stainless steel 30 is obtuse.

As will subsequently be discussed in detail, the Ga-Cu alloy in the "wetting" condition as shown in FIG. 4A is undesirable when it is applied to an exchangeable electrode 30, since the alloy 20 sticks on the electrode 30 and will spill out from the electrode 30 when the electrode 30 is exchanged. On the contrary, the alloy 20 in the "repelling" condition as shown in FIG. 4B is desirable, since the alloy 20 does not stick on the electrode 30 at the time of exchange of the electrode 30 and accordingly the life of the alloy 20 is semipermanent.

A relationship between a composition ratio parameter x of the $Ga_{1-x}Cu_x$ alloy and a condition of "repelling" is illustrated in FIG. 5. As shown, when the parameter x is less than 0.001, the alloy is in the "wetting" condition. When the parameter x is greater than or equal to 0.001, the alloy is in the "repelling" condition as illustrated by a oblique line area in FIG. 5. Particularly within the range of $0.001 \leq x \leq 0.02$, a degree of "repelling" is higher than that at a parameter x of greater than 0.02.

As seen from the foregoing description relating to FIGS. 2, 3 and 5, a parameter range from 0.001 to 0.03 is most preferable to a $Ga_{1-x}Cu_x$ alloy capable of holding stably its liquid phase in the "repelling" condition with respect to Cu or stainless steel member at the normal temperature 20° C. Accordingly, the $Ga_{1-x}Cu_x$ alloy having a parameter x within this range is very effective when it is applied for the exchangeable electrode.

Examples of manufacturing processes of a $Ga_{1-x}Cu_x$ alloy according to the invention, in which a parameter x is greater than or equal to 0.0001 and less than or equal to 0.03, will be described.

As a first step, liquid high purity gallium (Ga) and powder of copper (Cu) (both having a purity of 99.99% or more, are heated at 30° C. or more and then the heated gallium and copper are put into a crucible of graphite and then are well stirred by a graphite rod. At this stage, the composition ratio parameter x of $Ga_{1-x}$ to $Cu_x$ is 0.03 or less. Under this condition, when the temperature within the graphite crucible is approximately from 30° C. to 50° C., the copper powder is perfectly melted into gallium. If the copper to be mixed with gallium is degassed in a high vacuum atmosphere at approximately 300° C. in advance, the melting of copper into gallium is further facilitated. A crucible of quartz may be used instead of the graphite crucible, when it is used at 50° C. or less, since it does not react with the alloy contained in the crucible.

In another example of manufacturing processes of a Ga-Cu alloy according to the invention, gallium is contained in a hole formed in a block of high purity copper and gallium is heated together with the copper block at a temperature 250° C. or more in an atmosphere of argon (Ar) gas. Through this heating process, the copper hole is melted into the gallium to form Ga-Cu alloy. For example, gallium of 5 g was used and the contact area between gallium and the copper hole was 5 mm². After the copper block and gallium were heated at 280° C. for five minutes, a $Ga_{1-x}Cu_x$ alloy with a composition ratio parameter x in a range from 0.0001 to 0.03 was formed.

An exchangeable electrode for an evaporation system according to the invention in which a Ga-Cu alloy according to the invention which has been mentioned above will be described with reference to FIG. 6.

Figure 6:
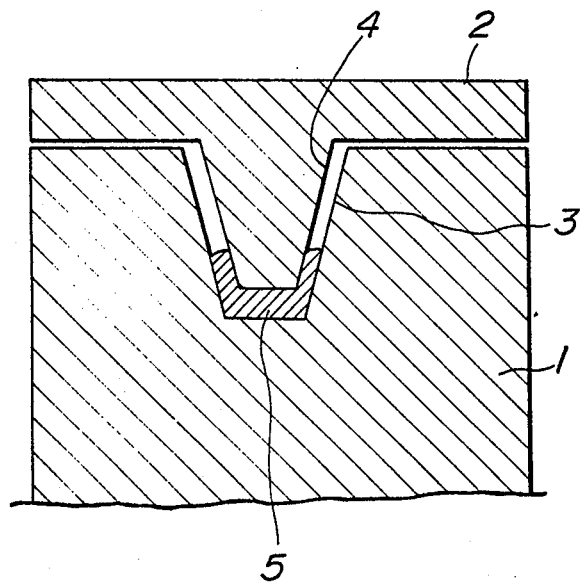
FIG. 6 shows a cross sectional view of an exchangeable electrode according to the invention.

In FIG. 6 illustrating in a cross sectional form an embodiment of an exchangeable electrode according to the invention, reference numeral 1 designates a fixed electrode section connected to an evaporation source (not shown), and 2 designates an exchangeable electrode section on which an evaporation material or source (not shown) is placed. The fixed electrode section 1 has a first contact terminal 3 in the form of a concave portion. The exchangeable electrode section 2 has a second contact terminal 4 in the form of a convex portion. When those electrode sections 1 and 2 are engaged with each other, the second convex contact terminal 4 is loosely fitted to or inserted in the first concave contact terminal 3, with a clearance formed therebetween so as to facilitate the removal of the exchangeable electrode section 2 from the fixed electrode section 1. A depression defined by the first concave contact terminal 3 is filled with a liquid Ga-Cu alloy 5 according to the invention. As a result, when the exchangeable electrode section 2 is fitted or inserted into the fixed electrode section 1, the clearance portion formed between the first and the second contact terminals 3 and 4 is filled with the Ga-Cu alloy 5. Accordingly, those terminals 3 and 4 will contact electrically with each other.

The composition ratio parameter x of the Ga-Cu alloy 5 is selected to be $0.0001 \leq x \leq 0.03$. The alloy with this range of a composition ratio parameter x has a melting point of 29.5° C. or less (see FIG. 2). When the parameter x is less than 0.0001 or greater than 0.05, the melting point is 29.5° C. or more, as seen from FIG. 2, and therefore the alloy does not exhibit the liquid phase at the normal temperature. This means that the alloy with such a parameter x is inappropriate to the exchangeable electrode mentioned above.

The saturated evaporation pressure of the Ga-Cu alloy according to the invention is $10^{-11}$ Torr or less at 450° C. and hence a vacuum chamber in which the electrode is contained is hardly contaminated, since Ga or Cu hardly evaporates when the electrode sections 1 and 2 are heated. There is mercury as metal exhibiting a liquid phase at the normal temperature. The saturated evaporation pressure of mercury is $10^{-3}$ Torr at the normal temperature. Therefore, the contamination by the evaporation is heavy. Mercury is poisonous and its handling is difficult. In this respect, mercury is not appropriate to the exchangeable electrode according to the invention. On the contrary, a Ga-Cu alloy according to the invention is not poisonous and can be handled easily.

Furthermore, in the exchangeable electrode according to the invention, the exchangeable electrode section 2 covers the fixed electrode section 1 when an evaporation is performed. Therefore, the material evaporated from the evaporation source placed on the exchangeable electrode section 2 never scatters into the clearance portion between the first and the second contact terminals 3 and 4 to reduce a purity of the Ga-Cu alloy 5 which is filled in the clearance portion.

When a current flows through the Ga-Cu alloy 5, the Ga-Cu alloy is heated by its current passage. When the temperature of the alloy is heated to 250° C. or more, the electrode sections 1 and 2 usually made of copper or stainless steel melts into the alloy 5 to change the composition ratio of the Ga-Cu alloy 5. It is suggested therefore that the temperature rise of the alloy 5 is preferably restricted below 200° C. For this reason, the contact areas between the fixed electrode section 1 and the alloy 5 and between the exchangeable electrode section 2 and the alloy 5 are selected to be 1 mm² or more when the current passing through the alloy 5 is 20A, and 1 cm² or more for 200 A of the current passing through the alloy. Further, when the first and the second electrode sections 1 and 2 are formed cylindrically, the following dimensions of the electrode sections 1 and 2 could restrict the temperature rise of the alloy 5 below 200° C.: 15 mm$\phi$ for diameters of the electrode sections 1 and 2; 5 mm$\phi$ for the outer diameter of the upper portion of the second contact terminal 4; 3 mm$\phi$ for the lower portion of the same; 8 mm$\phi$ for the outer diameter of the upper portion of the first contact terminal 3; 5 mm$\phi$ for the outer diameter of the lower portion of the same.

Figure 7:
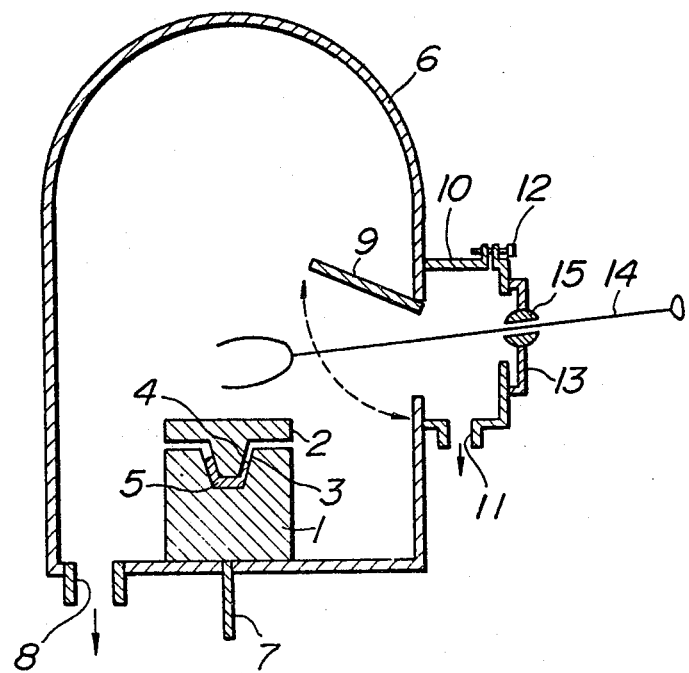
FIG. 7 shows a cross sectional view of an evaporation system using the exchangeable electrode shown in FIG. 6.

An embodiment according to the invention in which the exchangeable electrode mentioned above is applied for an evaporation system, will be described with reference to FIG. 7. In FIG. 7, the exchangeable electrode shown in FIG. 6 is accommodated in a vacuum chamber 6. The fixed electrode section 1 of the exchangeable electrode is connected to a power supply terminal 7. Reference numeral 8 designates a high vacuum exhaust port of the vacuum chamber 6, and reference numeral 9 designates a valve for sample transport of the vacuum chamber 6. A preevacuation chamber 10 is disposed on the outside of the vacuum chamber 6, concealing the sample transport valve 9. The preevacuation chamber 10 is provided with a preevacuation port 11, a leak valve 12 and a removable lid 13. The lid 13 is further provided with a spherical movable seal 15 through which a sample exchange rod 14 is hermetically inserted.

Here, explanation is made of a method of exchanging an evaporation source material, after it is evaporated, with a new source material in the evaporation system shown in FIG. 7. At the time that the evaporation work is completed, the sample transport valve 9 is closed and the preevacuation chamber 10 is in an evacuated condition through the preevacuation port 11 by means of a rotary pump, for example, to have a pressure of approximately $10^{-3}$ Torr. In order to exchange the exchangeable electrode section 2 on the fixed electrode section 1 under this condition, the sample transport valve 9 is first opened, the sample exchange rod 14 is put into the vacuum chamber 6 and then the exchangeable electrode section 2 is held and transported into the preevacuation chamber 10 by means of the sample exchange rod 14. As mentioned above, the spherical movable seal 15 hermetically and movably supports the sample exchange rod 14. Therefore, any directional movement of the sample exchange rod 14 causes no air-leak into the vacuum chamber 6. Then, the sample transport valve 9 is closed and then the leak valve 12 is opened to introduce air into the preevacuation chamber 10. Then, the lid 13 is opened to allow that the exchangeable electrode section 2 held by the rod 14 is carried out from the preevacuation chamber 10.

In order to place the exchangeable electrode section 2 having a new evaporation source material into the vacuum chamber 6, the operations in a sequence reverse to that mentioned above is sufficient. Therefore, no further description as to the placement of the electrode section in the vacuum chamber 6 will be made.

As described above, the exchange of evaporation sources can be made by merely placing the exchangeable electrode section 2 on the fixed electrode section 1, without any particular force which would otherwise be needed. Further, the presence of the clearance between the first and the second contact terminals 3 and 4 requires a less care in placing the electrode section 2 onto the electrode section 1. Additionally, a very short time for example, only 10 seconds) is sufficient in order to move the exchangeable electrode section 2 from the vacuum chamber 6 to the outside of the vacuum chamber 6 and vica versa. For example, when the exchangeable electrode section 2 with a new evaporation source is inserted into the vacuum chamber 6 in a vacuum condition of $1 \times 10^{-7}$ Torr, it takes only ten seconds or less until the vacuum chamber 6 restores the vacuum condition of $1 \times 10^{-7}$ Torr. Moreover, the electrode sections 1 and 2 electrically contact with each other through the conductive liquid, i.e. the Ga-Cu alloy 5 with a specific composition ratio parameter x, so that there never occurs any trouble of poor electrical conduction between the electrode sections 1 and 2.

When the composition ratio parameter x of the $Ga_{1-x}Cu_x$ alloy is determined within a range of $0.001 \leq x \leq 0.03$, the contact of the Ga-Cu alloy 5 with the electrode section 1 or 2, made of copper or stainless steel, is in the "repelling" condition. Therefore, the alloy 5 never spills out from the fixed electrode section 1 when the exchangeable electrode section 2 is removed from the fixed electrode section 1 (refer to FIGS. 4A and 4B). In this case, when the composition ratio parameter x of the alloy is selected within a range from 0.001 to 0.02, a degree of "adhesion" is the minimum and hence the Ga-Cu alloy having the composition ratio parameter x within this range is preferable.

As described above, the Ga-Cu alloy according to the invention is able to stably maintain the liquid phase at the normal temperature. The Ga-Cu alloy has a lower evaporation pressure at the normal temperature, compared with that of mercury. As a result, the vacuum chamber is not contaminated by the evaporation of Ga or Cu due to the heating of the electrode. Further, the Ga-Cu alloy of the invention is not poisonous, unlike mercury, which contributes to easy handling. With this useful features, the Ga-Cu alloy is excellent when it is used as the clearance filling material in the exchangeable electrode. If the range of the parameter x is selected from 0.001 to 0.03, the alloy having "repelling" condition against copper or stainless steel is obtained. When this alloy is used for the exchangeable electrode shown in FIG. 6, the liquid alloy does not spill out from the fixed electrode section at the time that the exchangeable electrode section is removed from the fixed electrode section for exchanging evaporation sources. Thus, the alloy is preferably assembled in the exchangeable electrode without the possibility that the evaporation system is disabled due to the spill of the alloy.

Ga-Cu alloy according to the invention is preferably applicable not only for an exchangeable electrode but also for a system where a stable liquid phase of the alloy is used at the normal temperature. For example, mercury which has been used in a mercury contact apparatus may be replaced by the Ga-Cu alloy according to the invention. This alloy according to the invention can be utilized as vacuum sealant, ultrasonic devices such as a delay line or wave medium for simulating wave movement.

With respect to the exchangeable electrode for the evaporation system according to the invention, the evaporation source may be removed by merely moving up and down the exchangeable electrode section having the evaporation source thereon, without applying any strong force thereonto. Accordingly, an accident of air-leak into the vacuum chamber is prevented. Further, the exchangeable electrode according to the invention is free from the mechanical abrasion produced when the exchangeable electrode section is forcibly made to contact the fixed electrode section by means of a brush or a spring. Therefore, the life time of the exchangeable electrode is extended. Additionally, the exchangeable electrode section is loosely fitted or inserted into the fixed electrode section, so that it is not necessary to precisely align the exchangeable electrode section with the fixed electrode section. This improves the exchanging operation of the evaporation sources from outside. Furthermore, the liquid contact of those electrode sections allows a stable supply of a large amount of current through the liquid alloy. When the contact areas of the Ga-Cu alloy with the fixed and the exchangeable electrode sections are properly selected in accordance with the magnitude of the passing current, and thereby the temperature rise of the alloy is limited below 200° C., the electrode sections are prevented from melting into the alloy, so that there is no possibility that the composition ratio of the alloy is changed and thus the alloy keeps its liquid phase stably.

In the evaporation system using an exchangeable electrode according to the invention, an evacuation time for evacuating the vacuum chamber is only ten seconds. Compared with the evacuation time of one hour of the conventional system, the evacuation time is improved by approximately 360 times. This improves the smooth and fast exchanging operation of the evaporation sources. In addition, the operation of exchanging evaporation source is simple and easy.

An exchangeable electrode according to the invention may be used not only in vacuum but also in any atmosphere so long as the atmosphere does not react with the Ga-Cu alloy of the invention. Therefore, the electrode is applicable for the evaporation or spattering system in a gaseous atmosphere.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A set of electrodes for an evaporation system comprising:
   a first electrode with a concave portion;
   a second electrode with a convex portion said convex portion of said second electrode being loosely insertable into said concave portion of said first electrode, at least one of said first and second electrodes being exchangeable; and $Ga_{1-x}Cu_x$ alloy, where $0.0001 \leq x \leq 0.03$, contained in said concave portion of said first electrode for filling a clearance portion between said first and second electrodes, when said second electrode is loosely inserted or fitted into said first electrode so as to electrically contact said first electrode with said second electrode.

2. A set of electrodes as claimed in claim 2, wherein the areas where said alloy contacts with said first and second electrodes are so selected to restrict the temperature rise of said alloy below 200° C. when current passes through said first and second electrodes.

* * * * *